(12) United States Patent
Janssen et al.

(10) Patent No.: US 11,041,899 B2
(45) Date of Patent: Jun. 22, 2021

(54) METHOD AND MEASURING ASSEMBLY FOR MONITORING A LINE

(71) Applicant: LEONI KABEL GMBH, Nuremberg (DE)

(72) Inventors: Bernd Janssen, Friesoythe Ot Neuscharrel (DE); Heiko Weber, Nortmoor (DE)

(73) Assignee: LEONI Kabel GmbH, Nuremberg (DE)

( * ) Notice: Subject to any disclaimer, the term of this patent is extended or adjusted under 35 U.S.C. 154(b) by 90 days.

(21) Appl. No.: 16/349,160

(22) PCT Filed: Oct. 30, 2017

(86) PCT No.: PCT/EP2017/077828
§ 371 (c)(1),
(2) Date: May 10, 2019

(87) PCT Pub. No.: WO2018/086949
PCT Pub. Date: May 17, 2018

(65) Prior Publication Data
US 2019/0271732 A1  Sep. 5, 2019

(30) Foreign Application Priority Data

Nov. 11, 2016 (DE) .......................... 102016222233.3

(51) Int. Cl.
*G01R 31/11* (2006.01)
*G01F 23/22* (2006.01)
*G01K 1/14* (2021.01)
*G01R 31/08* (2020.01)
*G01R 31/58* (2020.01)

(52) U.S. Cl.
CPC .............. *G01R 31/11* (2013.01); *G01F 23/22* (2013.01); *G01K 1/14* (2013.01); *G01R 31/088* (2013.01); *G01R 31/58* (2020.01)

(58) Field of Classification Search
CPC ...... G01R 31/11; G01R 31/58; G01R 31/088; G01F 23/22; G01K 1/14
See application file for complete search history.

(56) References Cited

U.S. PATENT DOCUMENTS

| 4,498,764 A | * | 2/1985 | Bolkow | ............... G01S 7/4818 |
| | | | | 356/5.06 |
| 4,734,637 A | | 3/1988 | Chen et al. | |
| 5,534,783 A | | 7/1996 | Meyer | |

(Continued)

FOREIGN PATENT DOCUMENTS

| CN | 1135368 C | 1/2004 |
| CN | 1466674 A | 1/2004 |

(Continued)

*Primary Examiner* — Akm Zakaria
(74) *Attorney, Agent, or Firm* — Laurence A. Greenberg; Werner H. Stemer; Ralph E. Locher

(57) ABSTRACT

In a method for monitoring a line, a measuring signal is fed into a measuring conductor at a start time. The measuring signal is reflected at an interference point or at a line end and the reflected portion is monitored to check whether a threshold value is exceeded. If the threshold value is exceeded, a digital stop signal is generated and the transit time between the start time and the stop signal is analyzed.

18 Claims, 4 Drawing Sheets

(56) References Cited

U.S. PATENT DOCUMENTS

| | | | |
|---|---|---|---|
| 6,087,978 A * | 7/2000 | Lalla | G01S 13/103 |
| | | | 342/118 |
| 6,707,307 B1 | 3/2004 | McFarlane et al. | |
| 6,771,076 B1 | 8/2004 | Smith | |
| 8,582,443 B1 | 11/2013 | Sun et al. | |
| 8,868,358 B2 | 10/2014 | Mayer | |
| 9,163,971 B2 | 10/2015 | Welle et al. | |
| 9,989,581 B2 | 6/2018 | Markalous et al. | |
| 10,488,273 B2 | 11/2019 | Koeppendoerfer et al. | |
| 2002/0034123 A1 | 3/2002 | Fuenfgeld | |
| 2002/0177961 A1 | 11/2002 | Lovegren et al. | |
| 2005/0052190 A1* | 3/2005 | McCosh | G01B 11/024 |
| | | | 324/644 |
| 2005/0057880 A1 | 3/2005 | Bailey et al. | |
| 2005/0073321 A1 | 4/2005 | Kohler et al. | |
| 2005/0140376 A1 | 6/2005 | Brown et al. | |
| 2005/0159915 A1* | 7/2005 | Schaumann | G01K 3/14 |
| | | | 702/130 |
| 2005/0213684 A1 | 9/2005 | Flake et al. | |
| 2006/0007991 A1 | 1/2006 | Wang et al. | |
| 2006/0012376 A1 | 1/2006 | Furse et al. | |
| 2006/0182269 A1 | 8/2006 | Lo et al. | |
| 2011/0015882 A1 | 1/2011 | Guilhemsang et al. | |
| 2011/0285399 A1 | 11/2011 | Ordones et al. | |
| 2011/0316559 A1 | 12/2011 | Haffner et al. | |
| 2013/0162262 A1 | 6/2013 | Johnson et al. | |
| 2014/0159743 A1* | 6/2014 | Dayal | G01R 27/02 |
| | | | 324/649 |
| 2015/0212025 A1 | 7/2015 | Francis-Buller et al. | |

FOREIGN PATENT DOCUMENTS

| | | |
|---|---|---|
| CN | 102159924 A | 8/2011 |
| CN | 102798434 A | 11/2012 |
| CN | 105765392 A | 7/2016 |
| DE | 1038140 A | 2/1954 |
| DE | 3712780 A1 | 10/1987 |
| DE | 4220409 A1 | 12/1993 |
| DE | 69022418 T2 | 3/1996 |
| EP | 1186906 A2 | 3/2002 |
| GB | 764657 A | 12/1956 |
| JP | S51150011 U | 12/1976 |
| JP | H04506255 A | 10/1992 |
| JP | 2003533907 A | 11/2003 |
| JP | 2006242815 A | 9/2006 |
| WO | 9015998 A1 | 12/1990 |
| WO | 9416303 A1 | 7/1994 |
| WO | 0167628 A2 | 9/2001 |
| WO | 2007090467 A1 | 8/2007 |
| WO | 2008135052 A1 | 11/2008 |
| WO | 2015091552 A1 | 6/2015 |

\* cited by examiner

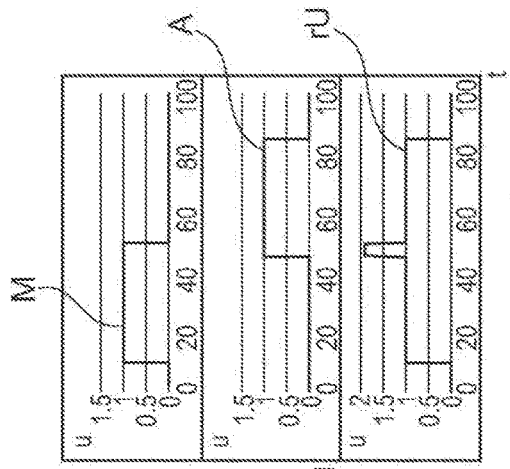
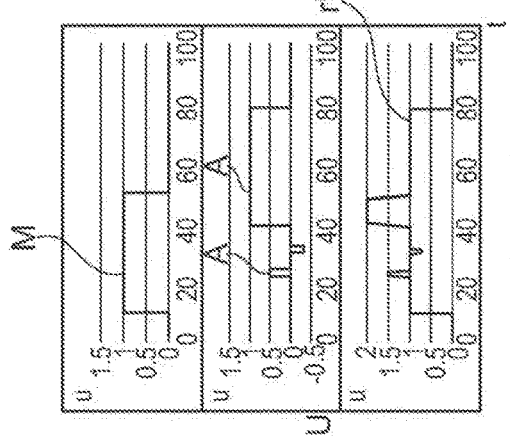
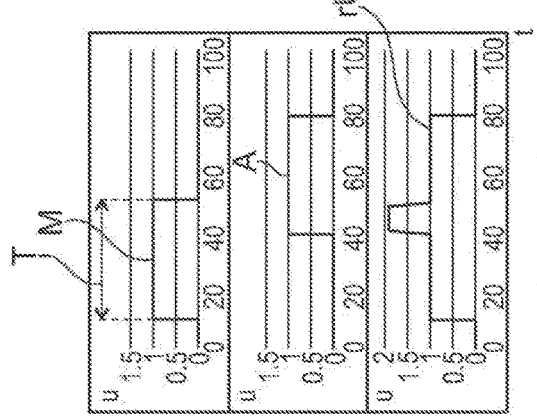
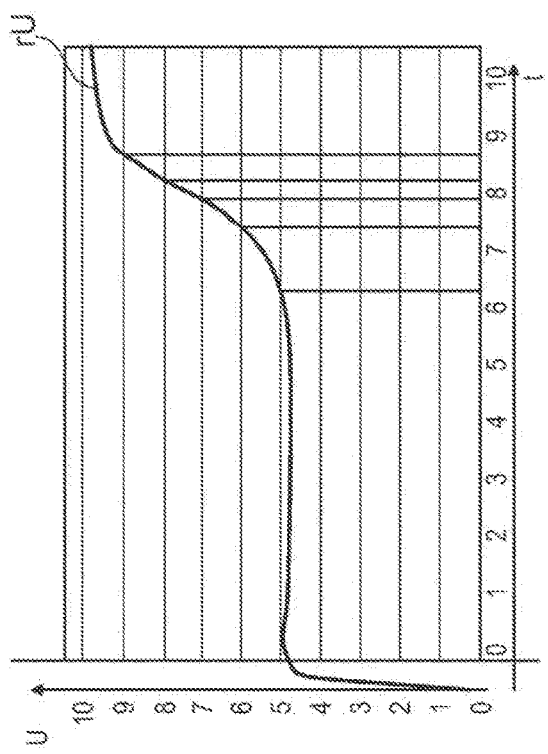

METHOD AND MEASURING ASSEMBLY FOR MONITORING A LINE

BACKGROUND OF THE INVENTION

Field of the Invention

The invention relates to a method and to a measuring assembly for monitoring a line for deviations from a normal state.

The line has for this purpose a measuring conductor which preferably extends along the entire length of the line.

The line serves, for example, for transmitting energy and/or signals and has for this purpose at least one wire, usually a plurality of wires, that is to say insulated conductors. A plurality of wires are often combined by means of a common cable sheath to form a line. Specifically in the case of data lines or signal lines, shielding layers are frequently also formed. In many applications, for example in the automotive field, lines are subject to diverse loads which are known with respect to their duration and magnitude. Frequently varying ambient conditions, for example influence of heat, also often cannot be estimated, or not estimated sufficiently, to be able to predict the wear of a line. In addition, the lines are also frequently subjected to mechanical loading, for example by vibrations, which can cause damage. In order to be able to ensure a specific minimum service life, a line is therefore typically configured in an overdimensioned fashion. There is also alternatively the possibility of monitoring and checking the line during operation or at least at regular intervals.

A known method for checking the line for defects is referred to as time domain reflectometry, known for short as TDR. In this context, a measuring pulse is fed into a conductor which extends along the line, and the voltage profile of a response signal is evaluated. In this context, the actual voltage profile is registered and correspondingly evaluated with a comparatively complex and expensive measuring apparatus. The TDR is usually used in measuring laboratories or in complex measuring assemblies. It is additionally very sensitive to ESD (electrostatic discharge).

However, such a method is not suitable for routine checking of a line, for example in the industrial field or in the automotive field, owing to the costs associated therewith, the complexity and the susceptibility to faults.

SUMMARY OF THE INVENTION

Against this background, the invention is based on the object of specifying a method and a measuring assembly by means of which cost-effective, in particular recurring or regular, monitoring of a line is made possible. The monitoring is to be carried out here, in particular, in an installed state of the line in an end product and/or in an operation which is provided for the line.

The object is achieved according to the invention by means of a method having the features as claimed in the independent method claim and by means of a measuring assembly having the features as claimed in the independent apparatus claim. Preferred refinements of the method and of the measuring assembly are respectively contained in the dependent claims. The advantages which are disclosed with respect to the method, and preferred refinements, can be correspondingly transferred to the measuring assembly, and vice versa.

The method and the measuring assembly make it possible, with a simple cost-effective design, to monitor a state variable relating to the line. The state variable is, for example, an internal state variable of the line, with the result that the state of the line itself is therefore monitored. Alternatively, an external state variable is checked. In this variant, the state of the surroundings, for example of a component to be monitored, is therefore checked indirectly.

The line which is to be monitored with the method has a measuring conductor into which a measurement signal is fed at a starting point. The measuring conductor is then monitored for the presence of a disruption point. A disruption point is generally understood to be a location at which the measurement signal is at least partially reflected. An at least partial reflection typically occurs when the characteristic resistance of the measuring conductor changes owing to the disruption point. The disruption point can also be a line end or a connection point. The measuring conductor is monitored for a portion which is traveling back and which is reflected at a line end or at one or more other disruption points. The amplitude of the portion which travels back is registered, and when a predefined voltage threshold value, referred to below for short as threshold value, is exceeded, a digital stop signal is generated. Furthermore, the transit time between the starting time and the stop signal is registered and evaluated. If a disruption point is not present, a stop signal is not generated, which indicates an intact line.

The exceeding of a threshold value is understood to mean, in particular, the positive exceeding of a value below the threshold value with respect to a value above the threshold value (exceeding in the narrower sense). In addition, exceeding the threshold value is also preferably understood to mean negative exceeding of a relatively high value with respect to a relatively low value (undershooting in the narrower sense).

The exceeding of the threshold is preferably detected with the aid of a comparator which therefore outputs a stop signal when the threshold is exceeded, in particular both in the case of positive exceeding and in the case of negative exceeding. The threshold value is, in accordance with the definition of a threshold value, basically unequal to zero and is, for example, at least 10% or more of the amplitude of the fed-in signal. If the fed-in signal is superimposed on the reflected portion, the threshold value is, for example, at least 10% above or below the amplitude of the fed-in signal.

The generation of merely a digital stop signal when a threshold value for the reflected portion is exceeded is of decisive significance for the cost-effective configuration of the method. A digital stop signal is understood here to be a binary signal which conveys merely a piece of digital state information yes/no (or 1/0). It therefore does not contain any information about the amplitude level of the reflected signal. Definitive information about the amplitude is obtained in combination with the selected threshold value, which is therefore a triggering threshold for the stop signal. Therefore, on the basis of the stop signal in combination with the threshold value it is therefore possible to make an assignment of a (minimum) amplitude of the reflected signal without this amplitude having to be measured.

The stop signal can in this context basically be an analog signal, but is preferably a digital signal, for example in the form of a voltage pulse or else a voltage jump. A comparatively simple evaluation circuit is made possible by the stop signal. In contrast to a TDR measurement, there is therefore particularly no time-resolved measurement of the actual voltage profile. A TDR measurement is not carried out. In particular for each individual measurement, i.e. after the emission of the measurement signal/each measurement signal, in particular precisely one stop signal is generated at a defined voltage threshold value and evaluated. The method according to the invention can easily be implemented with digital circuit technology. An analog/digital converter, such as is required with a TDR measuring assembly, is not used here.

The reflection takes place at a disruption point or generally at a point at which the characteristic resistance for the operating measurement signal changes. The measuring assembly is, in particular, embodied in such a way that a partial reflection or total reflection of the measurement signal takes place at the line end of the measuring conductor. For this purpose, the measuring conductor has, in particular, what is referred to as an open end.

Basically, an absolute evaluation of the measured transit time between the starting time and the stop signal is possible. It is therefore possible to infer the current temperature load of the measuring conductor directly from the transit time, for example, when there is a known line length, known characteristic resistance and in the case of a known temperature dependence (temperature-dependent) dielectric which is surrounding the measuring conductor. The location of a disruption point, for example a bend in the line etc., can also be directly detected from the actually measured transit time. For the measurement, preferably merely one measurement is carried out by means of the measuring conductor (in connection with a return conductor), in particular without the use of an additional reference conductor into which, for example, the measurement signal is fed in parallel as a reference signal (and if appropriate a reflected signal is evaluated).

However, such an absolute evaluation generally requires a high level of accuracy during the evaluation and, in particular, also very accurate knowledge about the properties of the line. In an expedient refinement, a comparison with a predefined reference is therefore also provided. At least a comparison with a reference duration for a transit time for a normal state of the line is provided. When there is a deviation with respect to the reference duration, a deviation from the normal state is detected.

In the simplest case, the line merely has the measuring conductor and a typically required return conductor. In such a case, the line is therefore embodied, for example, as a pure sensor line, which has, for example, no further function apart from the detection of the one or more state variables. Alternatively, the measuring conductor is a component of a line which is designed for the transmission of data and/or power and has, for example, a plurality of transmission elements. In one embodiment variant, a transmission of data or of power also takes place via the measuring conductor. In this variant, the measuring conductor therefore has a double function as a measuring conductor and as a normal conductor for transmitting data/electrical power. For the present measuring concept a conventional existing conductor therefore does not necessarily have to be expanded with an additional measuring conductor.

In one preferred refinement, a measuring cycle is carried out with a plurality of successive individual measurements, wherein precisely one stop signal is generated at each individual measurement, with the result that a plurality of stop signals with different transit times are acquired. In this context, a value pair comprising the threshold value which is set and the transit time is therefore recorded and stored at each individual measurement. The plurality of stop signals therefore extend here, in particular, over a time range of at least 10%, preferably of at least 30% and more preferably of at least 50% or of at least 75% of a total transit time of a portion which is reflected at the line end. The time range preferably comprises the total transit time of a portion which is reflected at the line end (under normal conditions, dry, 20° C.). In this context, the total transit time is therefore made up of the time period from the feeding in of the measurement signal into the measuring conductor at a feeding in location up to the arrival of the portion reflected at the line end at the feeding in location. This measure makes it possible for disruption points which are distributed over the line length to be registered or for specific disruption points to be measured more accurately with respect to the signal profile which is caused by them. The actual signal profile is therefore modeled—at least over a partial region—by the stop signals, that is to say specifically by the multiplicity of value pairs obtained for each stop signal (the magnitude of the threshold value and the transit time). These value pairs are therefore stored and evaluated, with the result that a signal profile is modeled on the basis thereof.

For the measuring cycle, a sequence of individual measurement signals is therefore fed into the measuring conductor (one measurement signal per individual measurement). The respective measurement signal is embodied here as a square-wave signal and a pause is present between two successive measurement signals. The pause time, that is to say the time between two measurement signals, is preferably longer, for example by at least the factor of 1.5 or 2, than the duration of the measurement signal. The ratio of the pause time to the signal time (pulse time) is, for example, 2:1. Specifically, this ratio varies in the course of the measuring cycle.

Furthermore, a maximum duration for the measurement signal is preferably predefined. The measurement signal is preferably switched off after the detection of the stop signal. That is to say the duration of the measurement signal typically varies between the individual measurements. However, if no stop signal is registered, the measurement signal ends after the predefined maximum duration is reached and the measurement is ended.

In the installed state lines frequently already have—in contrast to an idealized state—slight disruption effects which define the normal state but which are non-critical for the normal operation. Each of these disruption points generates here a partial reflection of the measurement signal. A respective line therefore already has a characteristic pattern of preferably a plurality of reflected portions in the normal state, which is referred to below as a reference pattern. Conversely, the line which is to be tested also has, after a certain operating duration, a stop pattern which characterizes the line at this time and which has the at least one stop signal. The stop pattern is expediently compared with the reference pattern and tested with respect to deviations. In addition to the transit times of the individual different reflected portions which are traveling back, in particular also the magnitude of the voltage values of the reflected portions is registered and evaluated. The reference pattern or stop pattern is formed here by a number of stop signals with different transit times.

The threshold value can preferably be set in a variable fashion. As a result, for example an evaluation of the reflected portions with respect to their signal level (voltage value) is made possible. Owing to the measuring principle with the generation of merely one digital stop signal when a threshold value is exceeded, an evaluation with respect to the signal level, that is to say the signal voltage of the reflected portion is therefore also made possible and performed by virtue of the variation of the threshold value. The actual signal level of the reflected portion is therefore detected. Different fail cases or situations can therefore be registered by means of this measure. The variation of the threshold value in combination with the measurement cycle composed of a plurality of individual measurements additionally makes it possible to approximate a signal profile with signal edges which occur and/or fall.

In one preferred refinement, the threshold value varies here over a range which corresponds to at least 0.5 times and preferably at least 0.75 times the amplitude of the measurement signal. In particular, the threshold value is varied, for example, over a range between 0.2 times up to 0.9 times or else up to 1 time the amplitude of the measurement signal. By means of successive individual measurements and varying of the threshold value, a signal profile is then produced or approximated. By varying over a comparatively large range of the amplitude measurement signal, both disruption points with only a small degree of reflection and disruption points with a high degree of reflection up to the total reflection are registered.

Within the scope of the measuring cycle with the plurality of individual measurements, the measurement signal is fed in at each individual measurement, and the threshold value is changed for various individual measurements, preferably for each individual measurement. Therefore, the multiplicity of individual measurements results in a multiplicity of stop signals which are then input into the characteristic stop pattern of the line which is to be tested, and in particular form the stop pattern.

The variation of the threshold value is therefore based on the idea that a number of characteristic disruption effects give rise to a defined amplitude of the reflected portion. As a result of the increasing of the threshold value, only those disruption points with a high reflected signal amplitude are then registered.

Owing to the measuring principle according to the invention, a respective individual measurement is preferably ended as soon as a stop signal has occurred. In order also to test the line reliably as to whether a plurality of disruption points which are of the same type and which each give rise to a reflected portion with a comparable signal amplitude, in one preferred refinement after a first individual measurement a measuring dead time is predefined during which the measuring assembly is quasi-deactivated and does not react to a stop signal. There is specifically provision here that after a first individual measurement and a registered first stop signal a second individual measurement is performed during which preferably the same threshold value as for the first individual measurement is set. The measuring dead time during which a stop signal is not registered is here (slightly) longer than the transit time, registered at the first individual measurement, between the starting signal and the stop signal. This avoids a situation in which the reflected portion which is assigned to the first stop signal is registered at the second individual measurement. This cycle is preferably repeated many times until no further stop signal is registered anymore. That is to say the measuring dead time is respectively adapted to the transit time of the (first, second, third etc.) stop signal which is registered at the preceding individual measurement, that is to say is selected to be slightly longer, until no further stop signal occurs anymore at this set threshold value.

A signal profile is expediently measured by suitably setting the respective measuring dead time in combination with a variation of the threshold value. In particular, in this way even falling edges in the signal profile are registered. Signal peaks with edges which are curved or which are falling can therefore be registered and evaluated.

Therefore, the transit times (stop signals) of the reflected portions are registered by means of the multiplicity of individual measurements, generally at different defined threshold values. In this respect, this method can be considered to be a voltage-discrete time-measuring method. The number of the individual measurements is preferably above 10 here, more preferably above 20 and also above 50 and, for example, up to 100 or even more individual measurements.

The measurement signals which are fed in typically propagate within the measuring conductor at a speed between 1 to 2.5 $10^8$ m/s. With the line lengths which are specifically of interest here, for example of typically 1 to 20 meters in the field of motor vehicles, the transit times for the measurement signal are therefore in the range of several nanoseconds up to several 10 s of nanoseconds.

In order to ensure sufficient resolution, the measuring dead time is selected here to be expediently 0.1 to 1 nanoseconds (ns), preferably 0.5 ns, longer than the previously registered transit time of the stop signal.

Furthermore, by means of the variation of the threshold value, what is referred to as a triggering threshold is preferably determined, on the basis of which triggering threshold a measure of a characteristic resistance is determined. By successively changing (increasing) the threshold value, the maximum value for the signal amplitude of the reflected portion is registered at least approximately (as a function of the stages of the threshold value). Since the signal amplitude is a measure of the magnitude of the characteristic resistance at the disruption point, the (absolute) magnitude of the characteristic resistance can therefore be determined from this. On the basis of the triggering threshold, a decision criterion as to whether the line is still in a sufficiently good state or must possibly be replaced is then also acquired. In addition to an absolute evaluation there is in turn the possibility of evaluation by comparison with the reference pattern, wherein it is then decided, for example as a function of the extent of an increase in the magnitude of the signal amplitude of the reflected portion, whether the line is still good.

There is basically the possibility of feeding in a comparatively short measurement signal in the manner of a measurement pulse into the measuring conductor and then registering the reflected portion. However, this in turn requires a very accurate and high-precision feeding in and measuring assembly. Therefore, there is preferably provision that the fed-in measurement signal has a signal duration which corresponds at least to twice the signal transit time of the measurement signal through the line with the defined line length, with the result that the reflected portion is superimposed on the measurement signal. Correspondingly, the threshold value is also above the voltage of the measurement signal. According to one alternative variant, the threshold value is also below the voltage of the measurement signal.

The signal duration preferably corresponds here to a frequency in the kHz range and, in particular MHz range and is, for example, at maximum approximately 8 MHz. The duration of the measurement signal is therefore not decisive for the measuring principle. However, a long signal duration when carrying out the measuring cycle gives rise to an increase in the total measuring duration when measuring the line. A multiplicity of individual measurements, for example more than 10, more than 20, more than 50 or even more than 100 individual measurements, is preferably carried out for one measuring cycle. Therefore, a signal duration in the MHz range, specifically in the range from 1 to 10 MHz, is preferably selected.

In one preferred refinement, the signal duration of the measurement signal is set differently at different individual measurements. Specifically, the signal duration is adapted to the transit time until the reflected portion arrives, i.e. the signal duration is set as a function of the transit time of the reflected portion and corresponds, for example, at least to this transit time or is slightly (+10%) longer than said transit time. The feeding in of the measurement signal is actively ended by the controller as soon as the stop signal is registered. This adaptation and variation of the signal duration of the measurement signal promotes speeding up of the measuring cycle, i.e. a reduction in the total measuring duration.

The measuring signal generally has a known geometry and is embodied, in particular, as a square-wave signal. Said signal expediently exhibits here a very steeply rising edge in order to achieve a measurement result which is as defined as possible. As steep as possible is understood here to mean, in particular, that the rise is 10% to 90% of the amplitude of the measurement signal occurring within a maximum 2000 ps (picoseconds), and preferably within a maximum 100 ps.

As has already been explained above, a multiplicity of individual measurements are preferably carried out within the scope of one measuring cycle in order to measure the conductor. A multiplicity of stop signals, which are arranged in a chronologically distributed fashion, are preferably acquired from the multiplicity of these individual measurements. The multiplicity of the stop signals therefore represents approximately the actual signal profile of the fed-in measurement signal and the reflected portions. The actual signal profile for a fed-in measurement signal which is reflected at the power end is expediently approximated from these stop signals, by means of a mathematical curve fit.

The approximated signal profile is preferably also visualized here in order to permit a visual comparison with a likewise approximated signal profile of the reference pattern.

During the multiplicity of individual measurements, the procedure generally adopted is that the threshold value is varied successively, wherein different threshold value stages are preferably set. The finer the stages, the more precisely the profile can be approximated. The stages between two successive threshold values are preferably adapted here, for example, as a function of the previously registered measurement results. If, for example, a stop signal is registered, the smallest possible stages with respect to the next threshold value are set (increasing/decreasing) until a signal peak which describes the respective disruption point is reached or has subsided again.

Furthermore, in one preferred refinement, a location of a disruption point is inferred on the basis of the transit time for the stop signal. Therefore, a location evaluation is generally also generated with respect to the disruption point and therefore a spatially resolved stop pattern is generated or evaluated.

In particular, in order to achieve the highest possible spatial resolution, the measuring assembly generally has a high time resolution. This is preferably less than 100 ps and preferably approximately 50 ps. That is to say two events which are spaced apart from one another chronologically by more than this time resolution are registered and evaluated as separate events.

In an expedient refinement, a time-measuring pattern (stop time-measuring pattern) with a plurality of lines is generated, wherein the transit times of stop signals of a defined (fixed) threshold value are stored in each line, wherein the defined threshold value varies from line to line. On the basis of this time-measuring pattern it is therefore possible to identify immediately which threshold value is exceeded at which point in time, with the result that there is immediate detection of which disruption points are located at which position.

Specifically, such a time-measuring pattern (reference time-measuring pattern) is also stored for the reference pattern, with the result that shifts can be very easily detected and evaluated by comparison with the stop time-measuring pattern. The respective time-measuring pattern is therefore, in particular, a two-dimensional matrix. The gaps indicate different transit times, and the lines illustrate different threshold values.

With respect to a comparison between the reference pattern and the stop pattern which is as simple as possible there is generally provision that the reference pattern is registered on the basis of the line in an initial state within the scope of a reference measurement. Here—as in the case of the stop pattern—in particular there is also provision for a predefined measurement cycle with a multiplicity (more than 10, more than 20, more than 50 or more than 100) of individual measurements to be carried out. Therefore, with this reference measurement overall the signal profile of the line in the initial state can be registered. The initial state is understood here to be an assembled state of the line or else a state in which the line is stored in a system or component. This is based on the idea that during the assembly, that is to say during the attachment of plugs or the connection to a component, original disruption points are typically already generated. These can be bending points as a result of an unfavorable profile of the line or else as a result of clamping points in the region of the plug. However, in the case of a satisfactory connection these original disruption points are non-critical for the normal operation of the line in a normal state or initial state. As a result of the measurement of the line in the normal state or initial state and the later measurement of the line after a certain operating duration, it is therefore easily detected whether, and to what extent, a change in the state of the line has already taken place. This measure also makes possible, in particular, a prognosis and is also performed with respect to a possible failure time of the line, or a residual service life. By means of this measure, it is therefore possible to react early to a defect which is becoming apparent, and the line can, for example, be replaced when necessary.

The measurement of the line is carried out here repeatedly, in particular in a periodically repeating fashion. Depending on the application there are seconds, minutes, hours, days or even months between the measurements. In the field of motor vehicles, for example testing can be respectively performed within the scope of a routine inspection.

The reference pattern is preferably stored in an encrypted, encoded form. This measure ensures that only authorized persons who have knowledge of the encoding can perform the checking and evaluation of the line.

The method is expediently used for monitoring the line for a temperature load or temperature overload. For this purpose, the measuring conductor is surrounded by insulation (dielectric) with a temperature-dependent dielectric constant. This involves, in particular, a specific PVC or else an FRNC (flame retardant non-corrosive) material. Insulating materials with a temperature-dependent dielectric constant are known. Owing to the temperature dependence, a change in temperature gives rise to a change in transit time of the reflected portion, with the result that the transit time of the registered stop signal is shifted in comparison with the reference duration of the reference pattern. Generally a changed temperature load is inferred from this chronological shift. The reference pattern is usually registered at an ambient temperature of, for example, 20° C. The determination of the transit time of a reflected portion which is reflected at the line end or at the spatially defined known disruption point is sufficient to detect a temperature which is averaged over the line length.

Furthermore, a measure of the changed temperature load is inferred from the measuring of the chronological shift. The absolute current temperature can be in turn inferred from this. Basically, this is also possible solely on the basis of the transit time, without comparison with the reference pattern. If a predefined temperature value is exceeded, this is identified as an overload of the line. However, a comparison with the reference pattern preferably takes place, and a possibly unacceptable temperature load is inferred for the relative shift.

In one preferred development, an external state variable outside the line is acquired by means of the method, in particular the value thereof is determined, wherein the external state variable changes along the line. This is based on the idea that external state variables which vary along the line are perceptible as disruption variables and as it were form disruption points which can also be registered by means of the method. The state variable is, for example, the temperature or else a change in the surrounding medium, for example a state change, in particular from gaseous to liquid.

The line is preferably used with the specific measuring method as a sensor, in particular as a filling level sensor. Specifically, an accurate determination of the filling level is made possible, in particular, in combination with the spatial resolution.

Alternatively, the line is embodied as a temperature sensor and is laid, for example, within a device which is to be monitored, wherein, in particular, a spatially resolved temperature determination is performed. Therefore, for example, regions with different temperatures can be detected or monitored within the device.

According to the invention, in order to carry out the method a measuring assembly is provided with a measuring unit which is designed to carry out the method. According to a first embodiment variant, the measuring unit is integrated directly in the assembled line, that is to say, for example, in a plug of the line or else directly in the line. As an alternative to this, according to a second variant the measuring unit is integrated into a control unit of an on-board power system, for example of a motor vehicle. In a third variant, the measuring unit is finally integrated into an external, for example hand-held, measuring device, wherein the latter can be connected in a reversible fashion to the line to be tested.

The measuring unit comprises here in an expedient refinement a microcontroller, an adjustable comparator, a signal generator and a time-measuring element. The measuring unit is, in particular, a digital, microelectronic circuit which is, for example, integrated onto a microchip. For the sake of simplicity, such a microchip can be produced as a measuring unit in large numbers and at low cost. The measuring unit can also be integrated directly into the line or within a plug. The measuring unit or the microchip is also preferably designed to output a warning signal and/or is connected to a superordinate evaluation unit. Furthermore, the measuring unit and/or the superordinate evaluation unit preferably also has a memory for storing the registered measured values.

The variable threshold value is set here using the measuring unit, in particular by means of the microcontroller, and is also varied automatically. The microcontroller is expediently generally configured here to carry out automatically the measuring cycle described above.

An exemplary embodiment of the invention will be explained in more detail below with reference to the figures, in which:

BRIEF DESCRIPTION OF THE SEVERAL VIEWS OF THE DRAWING

FIGS. 3A-3C show illustrations of the signal profile for different situation, FIGS. 4A, 4B show a voltage/time diagram with a reference curve and an assigned reference pattern (FIG. 4B)

DESCRIPTION OF THE INVENTION

Figure 1:
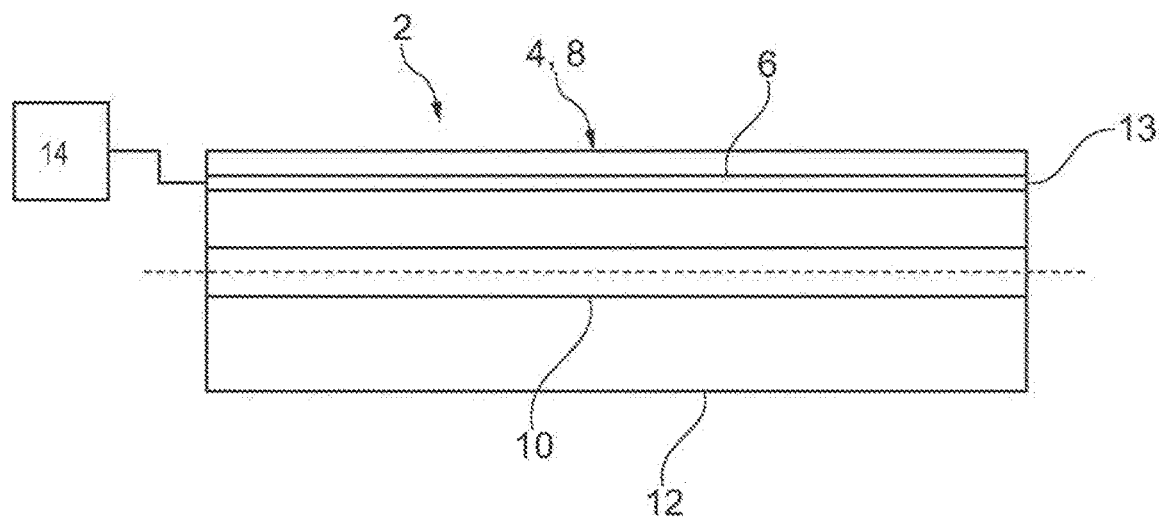
FIG. 1 shows a simplified illustration of a measuring assembly with a measuring unit and a line to be monitored.

FIG. 1 illustrates a measuring assembly 2. The latter has a line 4, which in turn has a measuring conductor 6 which extends in the longitudinal direction along the line 4, in particular along the entire extent thereof. The line 4 is in the exemplary embodiment shown in the simple single-wire line 4, that is to say has a wire 8 with a central conductor 10 which is surrounded by insulation 12. The measuring conductor 6 is embodied in this insulation 12. Basically, other designs are also possible. For example, the central conductor 10 can itself be used as a measuring conductor. The measuring conductor 6 is alternatively an internal conductor of a coaxial line. In this case, the measuring conductor is surrounded by insulation which surrounds a dielectric, and by an external conductor which is embodied, for example, as braid. The measuring conductor 6 is generally assigned a return conductor, which is not explicitly illustrated in the figures. Said return conductor is, for example, the external conductor of a coaxial line. Alternatively, measuring conductors 6 and return conductors are formed, for example, by a wire pair.

The measuring conductor 6 is connected together with the return conductor to a measuring unit 14, with the result that the line 4 can be monitored with respect to deviation from a normal state. Examples of such a deviation are excessive heating of the line 4 above a predefined operating temperature and/or damage, for example a break of the external conductor, for example owing to excessive bending of the line 4. The loads on the line 4 are also experienced by the measuring conductor 6.

Figure 2:
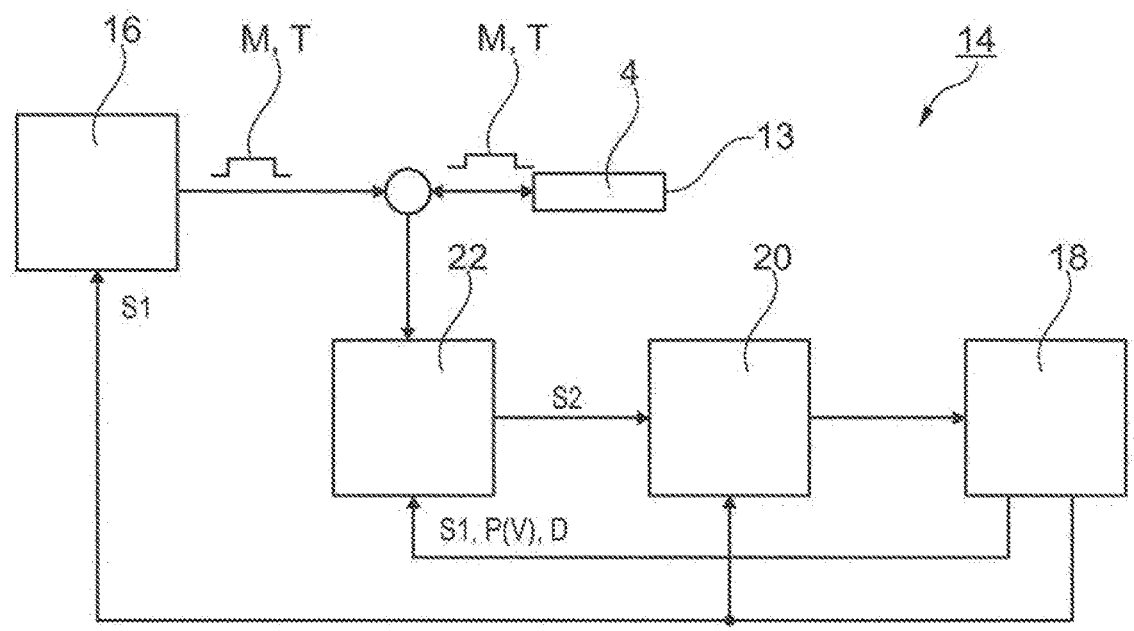
FIG. 2 shows a block diagram of the measuring unit in order to explain the method.

FIG. 2 shows a simplified block diagram illustration of the measuring unit 14 and serves to explain the method. The measuring unit 14 comprises a signal generator 16, a microcontroller 18, a time-measuring element 20 and an adjustable comparator 22. The microcontroller 18 serves to control and carry out the method. The microcontroller 18 therefore outputs a starting signal S1 to carry out a respective individual measurement. This starting signal S1 is transmitted both to the signal generator 16 and to the time-measuring unit 20. Furthermore, the microcontroller 18 transmits an adjustment signal P, by means of which a voltage threshold value V is predefined and set up on the comparator 22.

After the starting signal S1, the signal generator 16 generates a measurement signal M, in particular a square-wave signal which has a predefined time duration T. This measurement signal M is fed in to the line 4 at a feeding-in location 24. Within the line 4, the measurement signal M propagates in the direction of a line end 13 at which the measuring conductor 6 is embodied in an open fashion. As a result, the measuring signal M is reflected at the line end 13. The reflected portion A (cf. FIGS. 3A-3C) runs back in the opposite direction to the feeding-in location 24.

In the exemplary embodiment, the feeding-in location 24 is at the same time a measuring location 25 at which the signal level (voltage level) which is present at the measuring conductor 6 is tapped. However, by means of the comparator 22 it is only tested here whether the signal level exceeds (exceeding or undershooting in the narrower sense) the predefined threshold value V. As soon as the comparator registers that the threshold value V is exceeded, the comparator 22 outputs a stop signal S2 to the time-measuring element 20. The latter subsequently detects the time difference between the starting signal S1 and the stop signal S2 and transmits this difference as a registered transit time t for the reflected portion A. At this individual measurement, firstly just a single measurement signal M is fed in and the reflected portion A is evaluated. There is no feeding in of a plurality of measurement signals during the individual measurement.

After the individual measurement has taken place, the microcontroller 18 repeats the measurement. To do this, it varies the threshold value V, in particular if no stop signal S2 occurred before. In such a case (no stop signal), the measuring unit 14 breaks off the individual measurement after a predefined maximum measuring time.

In the event of a stop signal S2 occurring, the microcontroller 18 defines a measuring dead time D and transmits this, for example, to the comparator 22 or else to the time-measuring element 20. The measuring dead time D is typically several 10 ps above the previously registered transit time t. During this measuring dead time D, the time-measuring element 20 ignores possibly incoming stop signals S2, or the comparator 22 does not generate a stop signal S2.

The setting of the measuring dead time is preferably carried out by applying an additional blocking signal to the comparator 22, in particular at what is referred to as a latch input, which blocking signal causes the comparator to be deactivated for the duration of the applied blocking signal, that is to say it does not emit an output signal. This blocking signal is generated, for example, by a microcontroller.

In this context, when the threshold value V is exceeded both from below and from above, the comparator 22 outputs the stop signal S2. Therefore, if a voltage value is already present above the threshold V at the start of the evaluation or after the measuring dead time D, the comparator 22 does not output the stop signal S2 until the threshold V is undershot. As a result, in particular falling edges of the signal level can also be registered and evaluated.

The comparator 22 preferably has two states (1 and 0) which each indicate whether the current voltage value is above or below the threshold value. In the case of a change in state (change from 1 to 0 or from 0 to 1), the stop signal S2 is therefore output. The state of the comparator 22 can preferably also be evaluated, with the result that e.g. it can be directly determined whether the applied voltage is already above (or below) the threshold value V at the start of the measurement.

The signal profile, that is to say the actual voltage profile at the measuring location 25, is illustrated for different situations on the basis of FIGS. 3A to 3C. FIG. 3A shows here the signal profile of a line in the normal case (reference), FIG. 3B shows the signal profile in the case, for example, of a bending point as a disruption point, and FIG. 3C shows the signal profile in the case of a changed temperature load.

In all three figures, in each case in the upper part of the figure, the fed-in measurement signal M is respectively illustrated as a schematic square-wave signal with a predefined signal duration T. In the central part of the figure, in each case the reflected portion A is illustrated, and in the lower part of the figure the superimposed voltage which is applied at the measuring location 25 between the measurement signal M and the reflected portion A is illustrated. Therefore, a resulting signal profile rU is obtained at the measuring location 25 by superimposing the reflected portion A on the measurement signal M. In FIGS. 3A and 3B, the voltage U here is respectively indicated plotted against the transit time tin standardized units.

As can be clearly seen on the basis of FIG. 3B, the signal duration T is dimensioned in such a way that the reflected portion A is superimposed on the measurement signal M at the measuring location 25. The resulting signal profile rU therefore has (if the attenuation is ignored) twice the voltage of the measurement signal M for a certain time period.

In the case of a disruption point, as illustrated in FIG. 3B, an additional signal portion is reflected in the case of a relatively short transit time T. These additional reflected portions A are also clearly apparent within the superimposed signal profile rU.

A changed temperature generally gives rise to a different signal transit time of the measurement signal M. Since the measuring conductor 6 is open at the end and therefore reflection takes place at the end, the transit time t changes as a function of the temperature in a characteristic fashion, which leads to a shift of the reflected portion A in comparison with the reference illustrated in FIG. 3A. The actual measured extent of the change in temperature can be inferred on the basis of this shift.

Figures 5A, 5B:
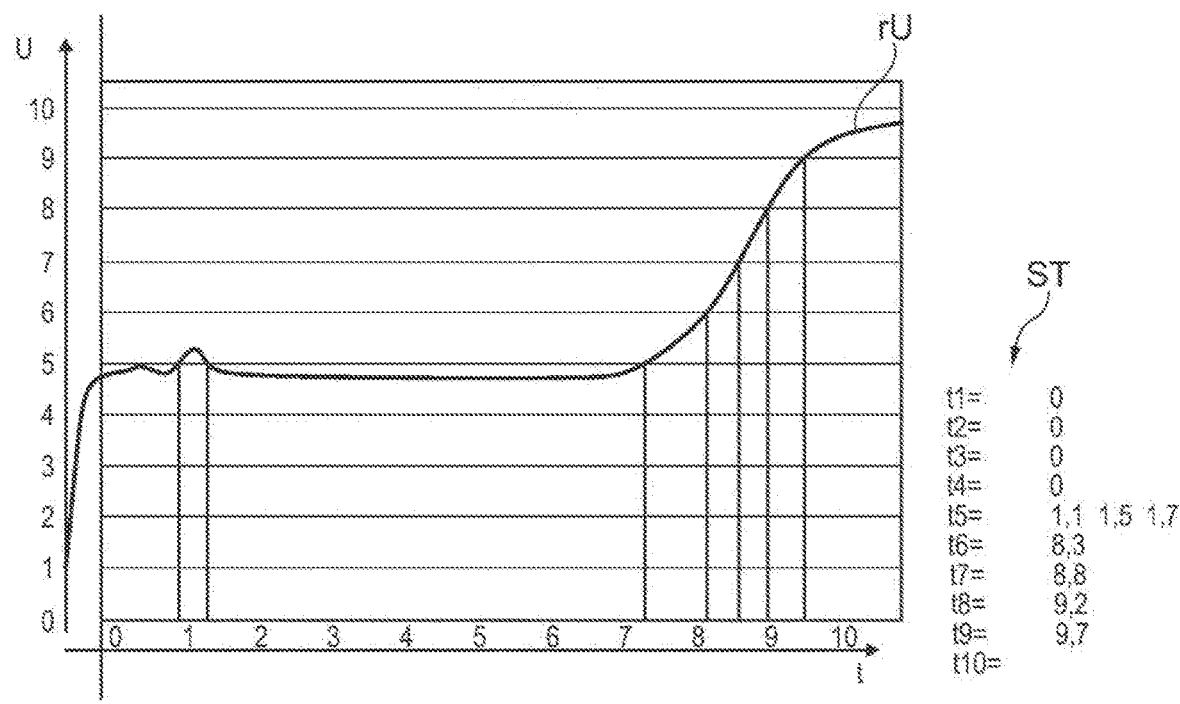
FIGS. 5A, 5B show a voltage/time diagram of a first measuring curve and an assigned stop pattern (FIG. 5B)
Figures 6A, 6B:
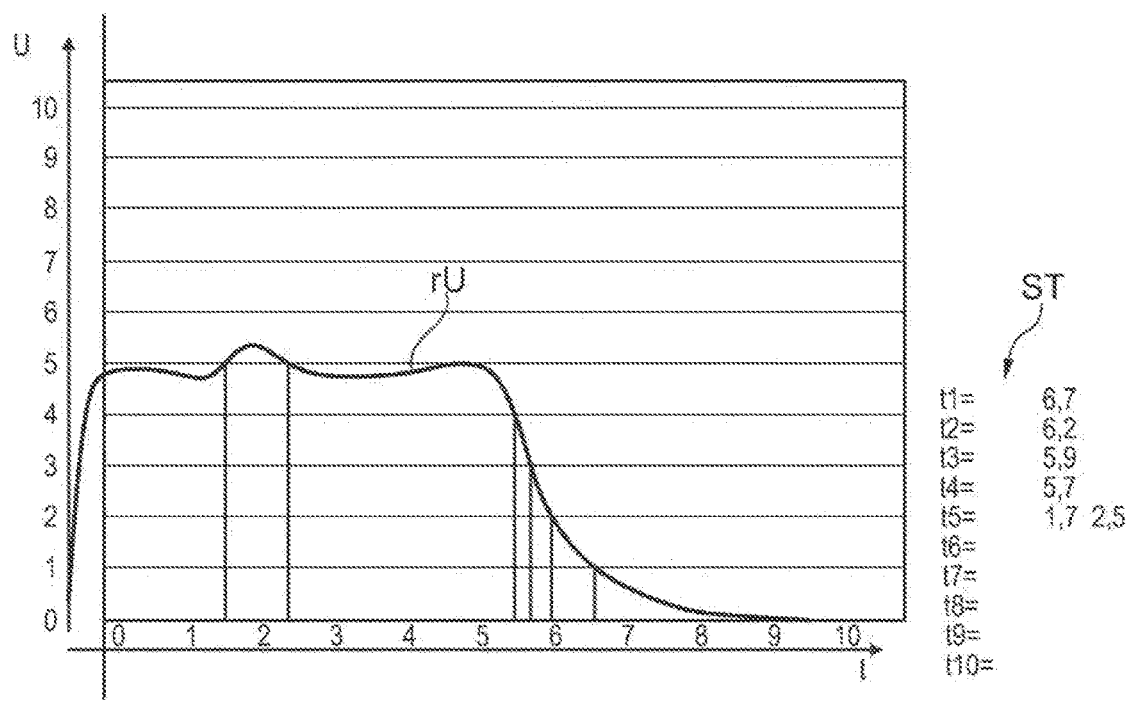
FIGS. 6A, 6B show a voltage/time diagram of a second measuring curve and an assigned stop pattern (FIG. 6B)

FIGS. 4A, 5A, 6A show resulting superimposed signal profiles rU at the measuring location 24 in a more realistic illustration. FIG. 4A shows here the superimposed signal profile rU in the normal state, that is to say in the case of a reference measurement. FIG. 5A shows the superimposed signal profile rU in the case of an additional disruption point and an increase in temperature. FIG. 6A finally shows the superimposed signal profile rU in the case of an additional disruption point and a short circuit in addition. The disruption point is, for example, a break or damage in the region of the measuring conductor 6, as a result of which the characteristic impedance generally changes and gives rise to reflection.

For each of these three situations the line 4 is respectively measured within the scope of a measuring cycle. In said cycle, the threshold values V are successively raised and the transit times t are registered for a respective assigned threshold value V. In the exemplary embodiments in FIGS. 4A, 5A and 6A the voltage is indicated in standardized units. The value 1 corresponds to, for example, 1 volt or else 100 mV. The amplitude of the fed-in measurement signal (voltage jump) is preferably 1 V. The threshold values are, for example, each increased in increments of 10% to 20% of the amplitude of the fed-in measurement signal. The trigger times for the assigned threshold values V, that is to say if triggering of the comparator 22 occurs by outputting a stop signal S2, are characterized in each case by vertical lines. A reference pattern REF, for example on the basis of FIG. 4B, or stop pattern ST, for example according to FIG. 5B or 6B, is generated on the basis of the multiplicity of individual measurements, in this case, for example, individual measurements are carried out as a total of 10 threshold values. In this context, the time is registered (in nanoseconds ns) for each threshold value V if the respective threshold value V is exceeded. The reference t1 stands here for the transit time t until the threshold value "1" is exceeded, and the reference t2 stands for the duration t until the threshold value "2" is exceeded etc.

In the case of the superimposed signal profiles rU with the additional disruption points, an additional signal peak with a rising and a falling edge can be detected.

There is preferably generally provision that the resolution, that is to say the distance between the threshold values, is set differently in different voltage ranges. For example, in first ranges, which exhibit e.g. a falling signal profile, for example in the region of the signal peak, the resolution is increased by reducing the distance between the threshold values V. In the exemplary embodiment, for example, the threshold values V are set in small increments in the voltage range between 4.5 and 5.5. The distances between successive threshold values are here, for example, below 1, preferably below 0.5 and more preferably below 0.2, in each case with respect to the standardized unit. Conversely, in second ranges a lower resolution is preferably set by means of larger distances between the threshold values. In the exemplary embodiment, this relates e.g. to the voltage ranges between 0 and 4.5 and between 6 and 9. The distances between successive threshold values are here, for example, above 0.5, preferably above 1 or preferably above 1.5, in each case with respect to the standardized units. The resolution is preferably set here by means of the microcontroller 18.

As is apparent on the basis of FIGS. 4A and 4B, the first 4 threshold values are assigned the transit time 0 (t=0), since the signal level of the superimposed signal profile rU is above these (low) threshold vales V from the start. Owing to the reflection on the line end 13, after a defined signal transit time which correlates with the line length, the voltage value rises continuously to approximately twice the value of the voltage of the measurement signal M. This brings about a situation in which a plurality of successive threshold values V are exceeded at different times t5 to t9.

The reference measured values, in particular the reference pattern REF of the reference measurement, are preferably stored in this context within a memory (not illustrated in more detail here) of the measuring unit 14 or alternatively also at another location, for example a superordinate evaluation unit.

The stop pattern according to FIG. 5B initially shows the same pattern at the low threshold values V for the voltage values 1 to 4. However, the value 5 is repeatedly exceeded, specifically at the time periods t5=1.1 ns; 1.5 ns and 7.5 ns. It is apparent from this that in the case of a transit time t between 1.1 and 1.5 ns a reflected portion A is present which can be attributed to a disruption point. Said disruption point could not be detected before in the case of the reference pattern REF. In this respect, on the basis of a comparison of the stop pattern ST with the reference pattern REF it is already possible to detect directly that the line 4 has been damaged in the course of operation. Depending on the degree of damage, the microcontroller 18 then decides whether and to what extent a warning signal is output.

Furthermore it is apparent that the transit times t6 to t9 for the signal portion A which is reflected at the line end 13 have shifted to longer transit times t. On the basis of this shift, in addition a changed, in particular increased, temperature load of the line 4 can be inferred. As a function of the shift, the microcontroller 18 in turn decides whether and to what extent a warning signal is output.

In the situation illustrated in FIG. 6A, no reflection occurs at the line end 13 owing to the short circuit. This is apparent from the fact that a reflected portion A can no longer be registered for relatively high threshold values V.

Figure 7A:
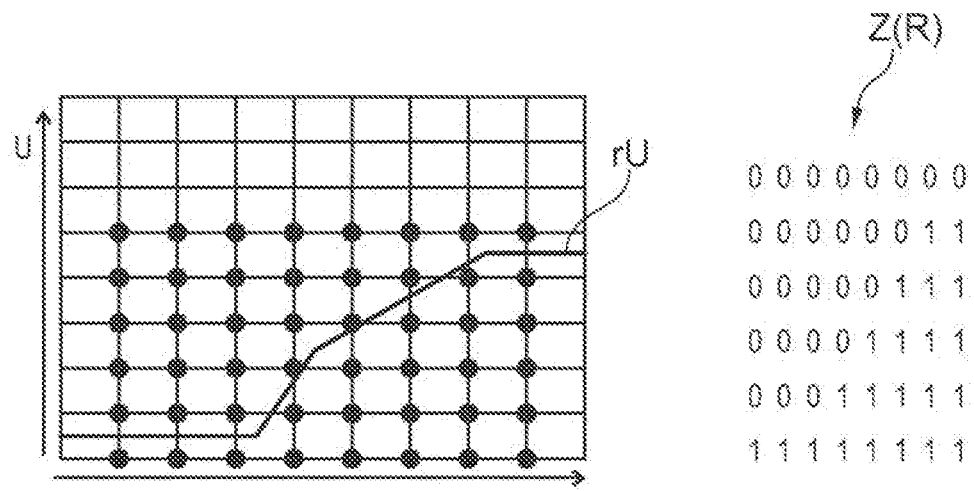
FIGS. 7A, 7B show a juxtaposition of a stop time-measuring pattern with respect to a reference time-measuring pattern.
Figure 7B:
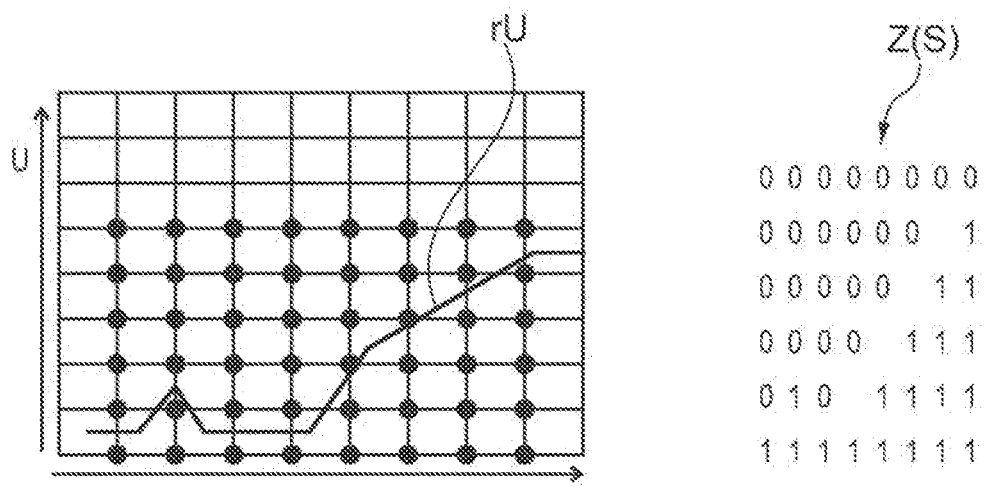

The results of a measuring cycle can basically also be stored within a time-measuring pattern Z, which is in the form of a matrix, as is illustrated on the basis of a reference time-measuring pattern Z(R) for the reference pattern REF and on the basis of a stop time-measuring pattern Z(S) for a stop pattern ST in FIGS. 7A and 7B. The left-hand half of the figure shows here in each case in turn the superimposed signal profile rU in the voltage/time diagram. In the respective time diagram Z, a respective row corresponds in each case to a fixed threshold value V, and a respective column is assigned either to a defined transit time t, or in a respective column (or cell) the actual measured value is given for the transit time t of the respective stop signal S2. The time-measuring patterns Z are illustrated, for example, as bit patterns with zeros and ones in FIGS. 7A and 7B. In this case, a respective column therefore corresponds merely to a fixedly predefined transit time t (time window). The typical superimposed signal profile rU can be tracked on the basis of the time-measuring pattern Z(REF) for the reference.

By means of a comparison of the time-measuring pattern Z(R) for the reference pattern REF with the time-measuring pattern Z(S) for the stop pattern ST according to FIG. 7B, it is clearly apparent here that a change has taken place. Firstly, in the case of the second voltage threshold value V ($2^{nd}$ row) and the second column, that is to say in the cell [2; 1], there is now a 1 instead of a 0. The cells [4; 2], [5; 3], [6; 4], [9; 5] are, in contrast to the time-measuring pattern Z(R) according to FIG. 7A, also not occupied, which also indicates a shift. These two time-measuring patterns Z(R), Z(S) are evaluated, for example, by comparison. Instead of a bit pattern, a time-measuring pattern is preferably produced, in which time-measuring pattern the precise transit times t, when the respective threshold V is exceeded or undershot, are recorded. In this context, in addition to increasing the accuracy, the required data volume is also reduced.

The invention claimed is:

1. A method for monitoring a line having a measuring conductor, which comprises the steps of:
   feeding a measurement signal into the measuring conductor at a starting time, and when a disruption point is present a measurement is at least partially reflected at the disruption point;
   monitoring the measuring conductor for a reflected signal portion;
   generating a digital stop signal when a threshold value is exceeded each time;
   registering and evaluating a transit time between the starting time and the digital stop signal;
   carrying out a plurality of individual measurements within a scope of one measuring cycle, and the measurement signal is fed in at each individual measurement, wherein the threshold value is varied for various individual measurements, wherein after a first stop signal has been registered at a first individual measurement, performing a second individual measurement, wherein at the second individual measurement a measuring dead time is predefined which is longer than a transit time which is registered for the first stop signal at the first individual measurement, with a result that the reflected signal portion which is assigned to the first stop signal is not registered at the second individual measurement, wherein the measuring dead time is respectively adapted to the transit time of the stop signal which is registered at a preceding individual measurement;

acquiring a plurality of stop signals with different transit times by means of a plurality of individual measurements, wherein at each of the individual measurements the threshold value which is set and the transit time which is associated with the threshold value are recorded as a value pair;

acquiring a signal profile from a plurality of value pairs;

generating a stop pattern which characterizes the line by the plurality of stop signals; and comparing the stop pattern with a reference pattern for a normal state of the line and is checked for a deviation, the stop pattern and the reference pattern have a plurality of reflected portions which are each generated by the disruption point, and the stop pattern and the reference pattern are formed by the stop signals with the different transit times.

2. The method according to claim 1, which further comprises carrying out the measuring cycle with a plurality of successive individual measurements, with a result that the plurality of stop signals with the different transit times are acquired, wherein the plurality of stop signals extend over a range which is at least 10% of a maximum total transit time which the measurement signal takes to travel from a feeding in location as far as a line end and back to the feeding in location.

3. The method according to claim 1, which further comprises varying the threshold value over a range which corresponds to at least 0.5 times an amplitude of the measurement signal.

4. The method according to claim 1, which further comprises registering rising and falling edges in the signal profile by means of the measuring dead time in combination with a variation of the threshold value.

5. The method according to claim 1, wherein by varying the threshold value a triggering threshold, on a basis of which a measure of a magnitude of a characteristic impedance for the measurement signal is determined, is acquired.

6. The method according to claim 1, wherein the measurement signal has a signal duration which corresponds to at least twice a signal transit time through the line, with a result that the reflected portion is superimposed on the measurement signal.

7. The method according to claim 1, which further comprises varying a signal duration of the measurement signal for the individual measurements.

8. The method according to claim 1, which further comprises generating a time-measuring pattern with a plurality of lines, wherein the transit times of the stop signals of a defined threshold value, which is different from line to line, are stored in each line.

9. The method according to claim 1, wherein the reference pattern is acquired by means of a reference measurement on a basis of the line in an initial state, and the stop pattern is subsequently measured.

10. The method according to claim 1, wherein the reference pattern is stored in a coded form.

11. The method according to claim 1, wherein a measuring conductor contains a lead and insulation which surrounds the lead and which has a temperature-dependent dielectric constant, with a result that a change in temperature gives rise to a changed transit time of the reflected portion, which change is evaluated with respect to a temperature load, wherein a changed temperature load is inferred from a chronological shift of the stop signal with respect to a reference duration.

12. The method according to claim 11, which further comprises measuring an extent of the chronological shift, and an extent of the changed temperature load is acquired from the extent of the chronological shift.

13. The method according to claim 1, which further comprises registering an external state variable which changes along the line.

14. The method according to claim 1, wherein the reference pattern is acquired by means of a reference measurement on a basis of the line in an initial state, and the stop pattern is subsequently measured repeatedly during an operating time.

15. The method according to claim 13, wherein the external state variable is a filling level.

16. A measuring assembly for monitoring a line, the measuring assembly comprising:

a measuring conductor;

a measuring unit, when said measuring conductor is connected to said measuring unit, said measuring unit is configured:

to feed a measurement signal into said measuring conductor at a starting time;

to monitor a portion reflected at a disruption point;

to generate a digital stop signal in each case when a threshold value is exceeded;

to register a transit time between the starting time and a stop signal;

to evaluate the transit time;

to carry out a plurality of individual measurements within a scope of one measuring cycle, and the measurement signal is to feed in at each individual measurement, wherein the threshold value is varied for various individual measurements, wherein after a first stop signal has been registered at a first individual measurement, performing a second individual measurement, wherein at the second individual measurement a measuring dead time is predefined which is longer than a transit time which is registered for the first stop signal at the first individual measurement, with a result that the reflected signal portion which is assigned to the first stop signal is not registered at the second individual measurement, wherein the measuring dead time is respectively adapted to the transit time of the stop signal which is registered at a preceding individual measurement;

to acquire a plurality of stop signals with different transit times by means of a plurality of individual measurements, wherein at each of the individual measurements the threshold value which is set and the transit time which is associated with the threshold value are recorded as a value pair, and a signal profile is acquired from the plurality of value pairs; and to generate a stop pattern which characterizes the line by means of a plurality of stop signals, and to compare the stop pattern with a reference pattern for a normal state of the line and to check it for a deviation, wherein the stop pattern and the reference pattern have a plurality of reflected portions which are each generated by the disruption point, and the stop pattern and the reference pattern are formed by stop signals with different transit times.

17. The measuring assembly according to claim 16, wherein said measuring unit is integrated into a plug of said line, a control unit of an on-board power system or into a measuring device.

18. The method according to claim 1, wherein the measuring dead time is selected to be long enough so that no further stop signal occurs at a set threshold value.

* * * * *